United States Patent
Villa

(10) Patent No.: US 11,961,588 B2
(45) Date of Patent: Apr. 16, 2024

(54) VARIABLE PAGE SIZE ARCHITECTURE

(71) Applicant: Micron Technology, Inc., Boise, ID (US)

(72) Inventor: Corrado Villa, Sovico (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/590,528

(22) Filed: Feb. 1, 2022

(65) Prior Publication Data

US 2022/0230668 A1    Jul. 21, 2022

Related U.S. Application Data

(62) Division of application No. 16/748,671, filed on Jan. 21, 2020, now Pat. No. 11,244,713, which is a
(Continued)

(51) Int. Cl.
*G11C 8/16*    (2006.01)
*G11C 7/04*    (2006.01)
(Continued)

(52) U.S. Cl.
CPC .............. *G11C 8/16* (2013.01); *G11C 7/04* (2013.01); *G11C 7/1012* (2013.01);
(Continued)

(58) Field of Classification Search
CPC .... G11C 8/16; G11C 8/10; G11C 7/04; G11C 7/1012; G11C 7/1045
See application file for complete search history.

(56) References Cited

U.S. PATENT DOCUMENTS 6,226,754 B1    5/2001    Ware et al.
6,320,790 B1 *  11/2001   Micheloni ........... G11C 11/5642
                                              365/185.21
(Continued)

FOREIGN PATENT DOCUMENTS

CN    101681672 A    3/2010
CN    103365783 A    10/2013
(Continued)

OTHER PUBLICATIONS

European Patent Office, "European Search Report," issued in connection with European Patent Application No. 17834995.7, dated Feb. 26, 2020 (10 pages).
(Continued)

*Primary Examiner* — Ryan Bertram
(74) *Attorney, Agent, or Firm* — Holland & Hart LLP

(57) ABSTRACT

Methods, systems, and devices for operating a memory array with variable page sizes are described. The page size may be dynamically changed, and multiple rows of the memory array may be accessed in parallel to create the desired page size. A memory bank of the array may contain multiple memory sections, and each memory section may have its own set of sense components (e.g., sense amplifiers) to read or program the memory cells. Multiple memory sections may thus be accessed in parallel to create a memory page from multiple rows of memory cells. The addressing scheme may be modified based on the page size. The logic row address may identify the memory sections to be accessed in parallel. The memory sections may also be linked and accessing a row in one section may automatically access a row in a second memory section.

20 Claims, 11 Drawing Sheets

Related U.S. Application Data division of application No. 15/223,753, filed on Jul. 29, 2016, now Pat. No. 10,566,040.

(51) Int. Cl.
*G11C 7/10* (2006.01)
*G11C 8/10* (2006.01)
*G11C 29/18* (2006.01)

(52) U.S. Cl.
CPC .............. *G11C 7/1045* (2013.01); *G11C 8/10* (2013.01); *G11C 2029/1804* (2013.01); *G11C 2207/2245* (2013.01)

(56) References Cited

U.S. PATENT DOCUMENTS

| | | | |
|---|---|---|---|
| 6,694,422 B1* | 2/2004 | Kim | G11C 11/4096 711/212 |
| 6,724,682 B2 | 4/2004 | Lee et al. | |
| 7,099,202 B1 | 8/2006 | Son et al. | |
| 7,254,075 B2 | 8/2007 | Woo et al. | |
| 7,483,333 B2 | 1/2009 | Skidmore | |
| 7,755,968 B2 | 7/2010 | Woo et al. | |
| 7,793,037 B2 | 9/2010 | Jain et al. | |
| 7,813,178 B2 | 10/2010 | Nakai | |
| 8,375,173 B2 | 2/2013 | Wang et al. | |
| 8,379,450 B2 | 2/2013 | Kim | |
| 8,549,209 B2 | 10/2013 | Pyeon et al. | |
| 8,751,903 B2* | 6/2014 | Byom | G06F 11/076 714/763 |
| 9,330,765 B2 | 5/2016 | Kim | |
| 2002/0181315 A1 | 12/2002 | Lee et al. | |
| 2003/0081492 A1* | 5/2003 | Farrell | G11C 11/4087 365/230.02 |
| 2006/0067146 A1 | 3/2006 | Woo et al. | |
| 2006/0087893 A1 | 4/2006 | Nishihara et al. | |
| 2006/0227602 A1 | 10/2006 | Honma et al. | |
| 2006/0271748 A1 | 11/2006 | Jain et al. | |
| 2007/0268765 A1 | 11/2007 | Woo et al. | |
| 2007/0280027 A1 | 12/2007 | Skidmore | |
| 2008/0151656 A1 | 6/2008 | Nakai | |
| 2009/0003120 A1* | 1/2009 | Mueller | G11C 7/1045 365/230.01 |
| 2009/0157983 A1* | 6/2009 | Bowyer | G11C 8/10 711/E12.001 |
| 2009/0196103 A1* | 8/2009 | Kim | G11C 16/08 365/185.23 |
| 2010/0115214 A1 | 5/2010 | Pyeon | |
| 2010/0177572 A1* | 7/2010 | Lee | G11C 5/02 365/230.06 |
| 2010/0220536 A1 | 9/2010 | Coteus et al. | |
| 2012/0033497 A1 | 2/2012 | Kim | |
| 2013/0262737 A1 | 10/2013 | Nakanishi et al. | |
| 2014/0133235 A1 | 5/2014 | Kim | |
| 2014/0140124 A1* | 5/2014 | Kang | G11C 13/004 365/158 |
| 2014/0219807 A1 | 8/2014 | Lattanzio et al. | |
| 2015/0254181 A1 | 9/2015 | Andre et al. | |
| 2016/0005469 A1* | 1/2016 | Kim | G11C 16/10 365/185.11 |
| 2016/0077749 A1* | 3/2016 | Ravimohan | G06F 3/064 711/103 |
| 2016/0147460 A1 | 5/2016 | Sohn et al. | |
| 2017/0236568 A1 | 8/2017 | Rho | |
| 2017/0278559 A1* | 9/2017 | Hush | G11C 7/1012 |
| 2018/0046405 A1* | 2/2018 | Hush | G11C 7/1012 |
| 2022/0270703 A1* | 8/2022 | Chandramani | G11C 16/102 |

FOREIGN PATENT DOCUMENTS

| | | |
|---|---|---|
| CN | 103985407 A | 8/2014 |
| CN | 104064213 A | 9/2014 |
| JP | 08-069696 A | 3/1996 |
| JP | 10-177797 A | 6/1998 |
| JP | 2003-331588 A | 11/2003 |
| JP | 2006-277786 A | 10/2006 |
| JP | 2006-294126 A | 10/2006 |
| JP | 2008-541334 A | 11/2008 |
| JP | 2011-511391 A | 4/2011 |
| KR | 10-2010-0117560 A | 11/2010 |
| WO | 2009/097677 A1 | 8/2009 |

OTHER PUBLICATIONS

International Search Report and Written Opinion received for PCT Patent Application No. PCT/US17/042895, dated Jan. 25, 2018, 16 pages.
Japan Patent Office, "Notice of Rejection Ground", issued in connection with Japan Patent Application No. 2021-065047 dated Apr. 5, 2022 (14 pages).
JPO, "Decision of Rejection," issued in connection with Japanese Patent Application No. 2019-503745, dated Dec. 8, 2020 (3 pages).
JPO, "Notice of Rejection Ground," issued in connection with Japanese Patent Application No. 2019-503745, dated Mar. 3, 2020 (7 pages).
Korean Patent Office, "Notification of Reason for Refusal", issued in connection with Korean Patent Application No. 10-2021-7041702, dated Mar. 30, 2022 (15 pages).
Taiwan Intellectual Property Office, "Office Action," issued in connection with Application No. 106125623, dated Dec. 7, 2018 (17 pages).
Taiwan Intellectual Property Office, "Office Action," issued in connection with Application No. 106125623, dated May 3, 2019 (8 pages).
Trial and Appeal Decision received for Japanese Application No. 2019-503745, mailed on Jan. 5, 2022, 4 pages (2 pages of English Translation and 2 pages of Original Document).
Chinese Patent Office, "Office Action and Search Report", issued in connection with Chinese Patent Application No. 201780047192.3 dated Nov. 10, 2022 (21 pages) (11 pages of English Translation and 10 pages of Original Document).
Liu, L. et al., "A Stream Detection and Prefetching Algorithm based on a Page-Level Stream Cache Structure", Computer Research and Development, vol. 46, No. 10, Oct. 15, 2009, pp. 1758-1767 (English Abstract only).
Korean Patent Office, "Office Action," issued in connection with Korean Patent Application No. 10-2022-7038632 dated Jul. 30, 2023 (10 pages) (5 pages of English Translation and 5 pages of Original Document).

* cited by examiner

VARIABLE PAGE SIZE ARCHITECTURE

CROSS REFERENCE

The present application for patent is a divisional of U.S. patent application Ser. No. 16/748,671 by Villa, entitled "VARIABLE PAGE SIZE ARCHITECTURE," filed Jan. 21, 2020, which is a divisional of and claims priority to and the benefit of U.S. patent application Ser. No. 15/223,753 by Villa, entitled "VARIABLE PAGE SIZE ARCHITECTURE," filed Jul. 29, 2016, each of which is assigned to the assignee hereof, and each of which is expressly incorporated by reference in its entirety herein.

BACKGROUND

The following relates generally to memory devices and more specifically to a memory device with a variable page size architecture.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

Some non-volatile memory devices may use device architectures similar to volatile memories. Such devices may have improved performance compared to other non-volatile and volatile memory devices. Because information is often represented with multiple binary bits (memory cells), many memory cells may be accessed at one time during a read or write operation. This memory page-based accessing may also improve the performance of the memory array. If the memory page is large, however, it may contain many bits that were not originally needed. Accessing those unused memory cells may waste energy and may require unnecessary components that occupy die space.

BRIEF DESCRIPTION OF THE DRAWINGS

The disclosure herein refers to and includes the following figures.

DETAILED DESCRIPTION

Figure 1:
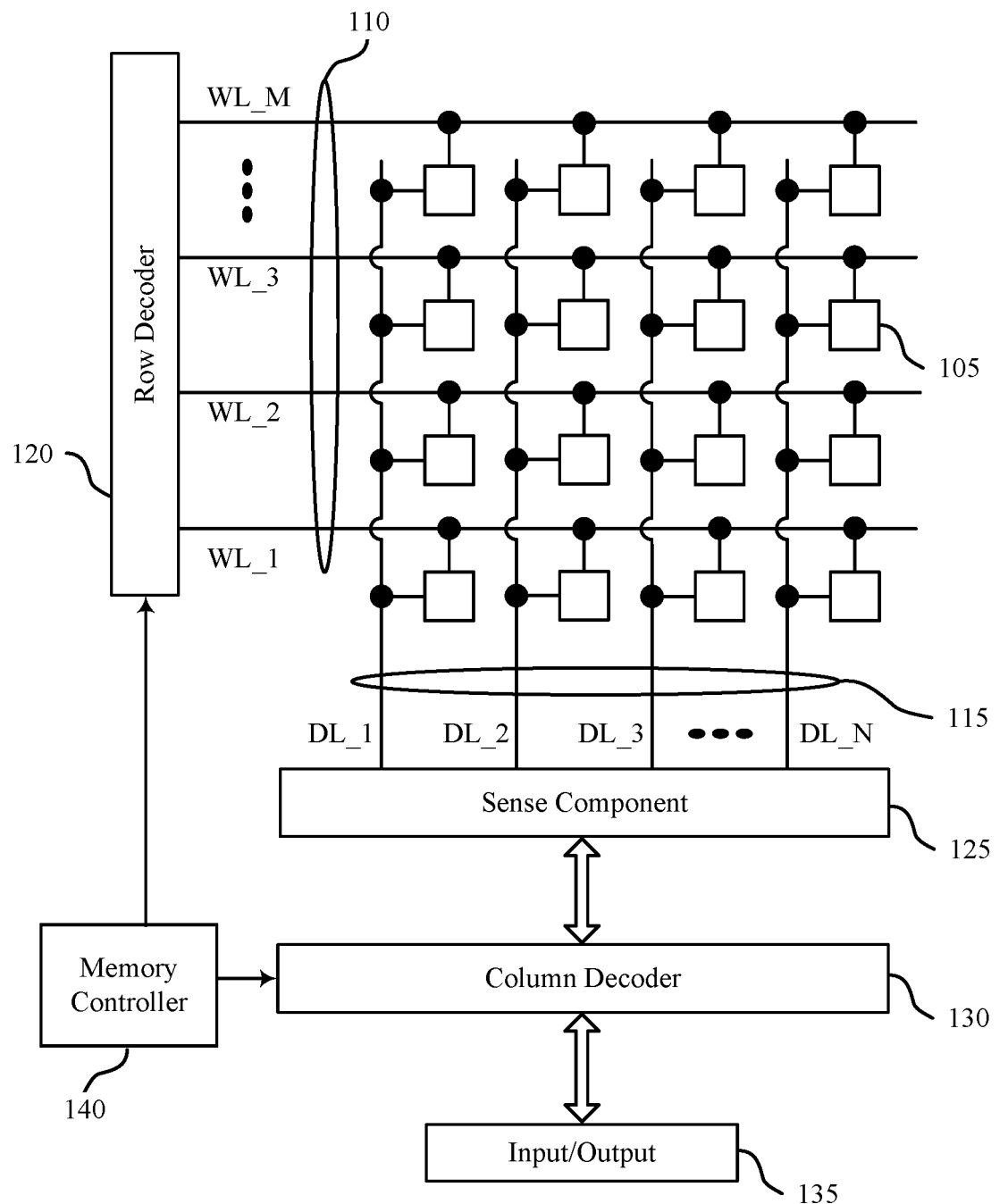
FIG. 1 illustrates an example memory array that supports a variable page size architecture in accordance with various embodiments of the present disclosure.

The page size of a memory array may be dynamically changed by accessing multiple rows of the memory array. The memory array may be composed of multiple memory banks, with each bank containing several memory sections. Each memory section may have an array of memory cells and a set of sense components (e.g., sense amplifiers) to read or program the memory cells. To open a memory page, a row within the memory section may be accessed and a subset of the memory cells within the row may be sensed and buffered. Because each memory section has its own set of sense components, multiple memory sections may be accessed in parallel to access multiple rows of the memory bank, thus enabling page sizes of variable size.

The addressing scheme may be modified based on the page size. A memory controller may pass a logic row address to the memory array to open a memory page. If multiple memory sections are accessed in parallel, the logic row address may identify the memory sections. In some example, the memory sections may be linked and accessing a row in one section may automatically access a row in a second memory section. Once a memory page is open, the memory controller may send a column access command that selects a subset of the memory page to be sent to the processor. The subset may be of fixed length and thus the column access command may vary as the page size changes. So the memory controller may modify the logic row address and the column address based on the page size.

Dynamic page size operation described herein may offer a number of benefits. For example, the die size may be decreased since fewer sense components are used—that is, only a subset of the memory cells within a row are read or programmed at one time. This also may reduce power consumption during operation. Further, if an increase in performance (e.g., overall time to access stored data in the memory array) is desired, then the page size may be increased by accessing multiple memory rows in parallel.

In some examples, the page size may be determined upon powering on a device that contains the memory array. In other examples, the page size may be changed by receiving a command. For example, a software application may determine a preferred page size based on various factors and then instruct the memory array to use such a page size.

Features of the disclosure introduced above are further described below in the context of a memory array. Specific examples are then described for a memory array that supports a variable page size as well as its operation. These and other features of the disclosure are further illustrated by and described with reference to apparatus diagrams, system diagrams, and flowcharts that relate to a variable page size architecture. The disclosure may relate to any non-volatile memory. Although some examples are discussed with reference to a ferroelectric capacitor, the present disclosure is not limited to ferroelectric memories. For example, the disclosure may relate to cross-point memories, resistive memories, chalcogenide-based memories, magnetic memories, flash memories, thin film memories, among other memory types.

FIG. 1 illustrates an example memory array 100 that supports a variable page size architecture in accordance with various embodiments of the present disclosure. Memory array 100 may also be referred to as an electronic memory apparatus. Memory array 100 includes memory cells 105 that are programmable to store different logic states. Each memory cell 105 may be programmable to store two states, denoted as a logic 0 and a logic 1. In some cases, memory cell 105 is configured to store more than two logic states. A memory cell 105 may be one of various logic storing devices, such as a ferroelectric capacitor, spin torque transfer device, magnetic tunnel junction, phase change device, memory transistor among others.

Operations such as reading and writing may be performed on memory cells 105 by activating or selecting the appropriate access line 110 and digit line 115. Access lines 110 may be referred to as word lines 110, and digit lines 115 may be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, doped semiconductors, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

Memory array 100 may represent a memory array, memory bank, or memory section. A memory array may be split into memory banks to improve parallel operations within a single memory component, such as a chip. A memory bank may be multiple rows and columns across multiple memory components (e.g., chips). A memory bank, memory section, or memory page may be part of a 2D or of a 3D memory array (e.g., memory array 100 may be 2D or 3D). A single read or write operation may be performed at one time within a memory bank. Thus, multiple memory banks may be operated in parallel in order to increase throughput for the overall memory array.

Each memory bank may be divided into memory sections in which each memory section has its own set of sense components 125. For example, a memory bank may be divided into 32 separate memory sections. By dividing a bank into sections, the total length of each bit line 115 within the memory section is reduced compared to a non-sectioned bank. These shorter bit lines 115 may improve the operation speed of the memory array.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. For volatile memories, activating the word line 110 may destroy the stored logic state of each memory cell 105 in electronic communication with the word line 110, thus requiring each memory cell 105 of the row to be sensed and its logic state may be written back. For non-volatile memories, this may not be the case—activating the word line 110 may place the memory cells 105 in electronic communication with their digit lines 115, but the logic state of each memory cell 105 may not be destroyed. As such, a word line 110 may be activated while only a subset of the memory cells 105 in the row may be sensed by sense component 125.

Accessing memory cells 105 may be controlled through a row decoder 120 and a column decoder 130. In some examples, a row decoder 120 receives a row address, which may be a string of binary bits, from the memory controller 140 and activates the appropriate word line 110 based on the received row address. For example, memory array 100 may include multiple word lines 110, labeled WL_1 through WL_M, and the row address may activate one of the word lines 110. Some or all of the memory cells 105 within the row may then be sensed by sense component 125 to determine the stored state of the memory cell 105. The detected logic state may be latched, or stored in a buffer, which may be part of column decoder 130. This process may be referred to as opening a memory page. The data of the memory page may then be repeatedly accessed (e.g., sent to the processor) without having to activate the word line 110 and sense component 125 each time. This may improve the access time of the memory array 100. In some cases, a linking relationship may exist between memory cells 105, word lines 110, or memory sections, as discussed in more detail below. In such cases, a row address may be directed at a first row, but row decoder 120 may access the first row and a second row based on the linking. In other words, row decoder 120 may activate a first word line 110 and a second word line 110. The second row may be in another memory section with another set of sense components 125.

Data contained in the memory page may then be output through column decoder 130 as output 135. For example, a column address may be sent to column decoder 130 to select one or a subset of logic values to output to a bus. This column address may be a string of binary bits to select the subset logic values. As the page size may dynamically change, the number of bits in the column address may also change. For example, if the page size doubles, twice as many subsets are now available, and the number of bits in the column address may be increased.

Upon accessing, a memory cell 105 may be read, or sensed, by sense component 125 to determine the stored state of the memory cell 105. In the example of memory cell 105 including a ferroelectric capacitor, after accessing the memory cell 105, it may discharge onto its corresponding digit line 115. Due to the non-volatile nature of a ferroelectric capacitor, discharging the ferroelectric capacitor may be based on biasing, or applying a voltage, to the ferroelectric capacitor. Other schemes may be possible for other non-volatile memories. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In some examples, a memory cell 105 may be written by applying a voltage to the logic storing component, for example, applying a voltage across a ferroelectric capacitor.

In some examples, the memory page size is configurable. Memory array 100 may represent one memory section of multiple memory sections within a memory bank. The page size may be made of multiple base memory pages, where the base page is a subset of memory cells 105 within a single row. For example, the number of sense components 125 may be less than the number of digit lines 115. Multiple rows are then accessed in parallel to create a larger page size by buffering multiple base pages. In some cases, the different rows may be in different memory sections, where each section has its own set of sense components 125.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. Non-volatile memory cells 105, however, may not discharge upon being connected to their digit lines 115. This may enable a subset of memory cells 105 within a row to be sensed without destroying the stored logic states of memory cells 105 that are not sensed.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Non-volatile memory cells 105 may, however, have beneficial properties that result in improved performance relative to other memory architectures. For example, a subset of memory cells 105 within a row may be accessed, enabling a smaller page size to be used during operation. By accessing multiple memory sections in parallel, the page size may be dynamically changed to optimize performance for the device using memory array 100.

The memory controller 140 may control the operation (e.g., read, write, re-write, refresh, page size determination, etc.) of memory array 100 through the various components, such as row decoder 120, column decoder 130, and sense component 125. Memory controller 140 may generate row and column address signals to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. Or memory pages of various sizes may be opened.

Figure 2:
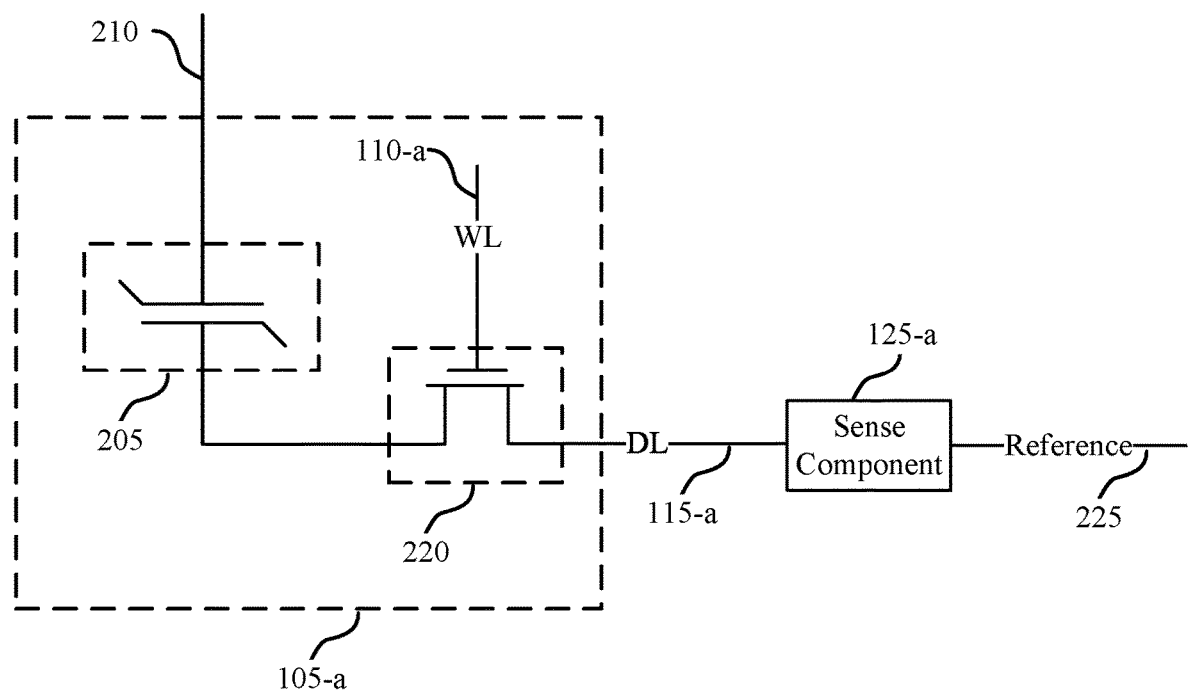
FIG. 2 illustrates an example circuit of a memory cell that supports a variable page size architecture in accordance with various embodiments of the present disclosure.

FIG. 2 illustrates an example circuit 200 that includes a memory cell 105 and supports a variable page size architecture in accordance with various embodiments of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage device 205, for example, a capacitor with electrodes capacitively coupled through a ferroelectric material positioned between them. Logic storage device 205 may represent other memory devices as described above. Circuit 200 also includes selection component 220 and reference signal 225. In the example of FIG. 2, logic storage device 205 may be accessed via plate line 210 and digit line 115-*a*. In some examples, plate line 210 may not be present. As described above, various states may be stored using logic storage device 205.

The stored state of logic storage device 205 may be read or sensed by operating various elements represented in circuit 200. Logic storage device 205 may be in electronic communication with digit line 115-*a*. For example, logic storage device 205 can be isolated from digit line 115-*a* when selection component 220 is deactivated, and logic storage device 205 can be electronically connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold voltage magnitude of the transistor. Word line 110-*a* may activate selection component 220; for example, a voltage applied to word line 110-*a* is applied to the transistor gate, connecting logic storage device 205 with digit line 115-*a*.

As described previously, the logic storage device 205 may not discharge upon connection to digit line 115-*a*. In some examples, a voltage may be applied to logic storage device 205 to sense its stored logic state. In one scheme, word line 110-*a* may be biased to select memory cell 105-*a* and a voltage may be applied to plate line 210. In some cases, digit line 115-*a* is virtually grounded and then isolated from the virtual ground prior to biasing plate line 210 and word line 110-a. Biasing plate line 210 may result in a voltage difference (e.g., plate line 210 voltage minus digit line 115-a voltage) across logic storage device 205. In the example of a capacitor, the voltage difference may yield a change in the stored charge on logic storage device 205, where the magnitude of the change in stored charge may depend on the initial state of logic storage device 205—e.g., whether the initial state stored a logic 1 or a logic 0. This may cause a change in the voltage of digit line 115-a based on the charge stored on logic storage device 205. In other schemes, plate line 210 may be held at a constant potential and the voltage of digit line 115-a may be controlled instead.

The change in voltage of digit line 115-a may depend on its intrinsic capacitance—as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference signal 225) by sense component 125-a in order to determine the stored logic state in memory cell 105-a.

Sense component 125-a may include various transistors or amplifiers to detect and amplify a difference in signals. Sense component 125-a may include a sense amplifier that receives and compares the voltage of digit line 115-a and reference signal 225, which may be a reference voltage. The sense amplifier output may be driven to the higher (e.g., a positive) or lower (e.g., negative or ground) supply voltage based on the comparison. For instance, if digit line 115-a has a higher voltage than reference signal 225, then the sense amplifier output may be driven to a positive supply voltage. In some cases, the sense amplifier may additionally drive digit line 115-a to the supply voltage. Sense component 125-a may then latch the output of the sense amplifier or the voltage of digit line 115-a, which may be used to determine the stored state in memory cell 105-a, e.g., logic 1. Alternatively, if digit line 115-a has a lower voltage than reference signal 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across logic storage device 205. For example, plate line 210 or digit line 115-a or both may be energized to apply a voltage across logic storage device 205. Additionally or alternatively, other access schemes for read or write operations may be used. For example, the access scheme may be adapted in accordance with the memory type if other technologies (i.e., other than FeRAM), are employed.

Figure 3:
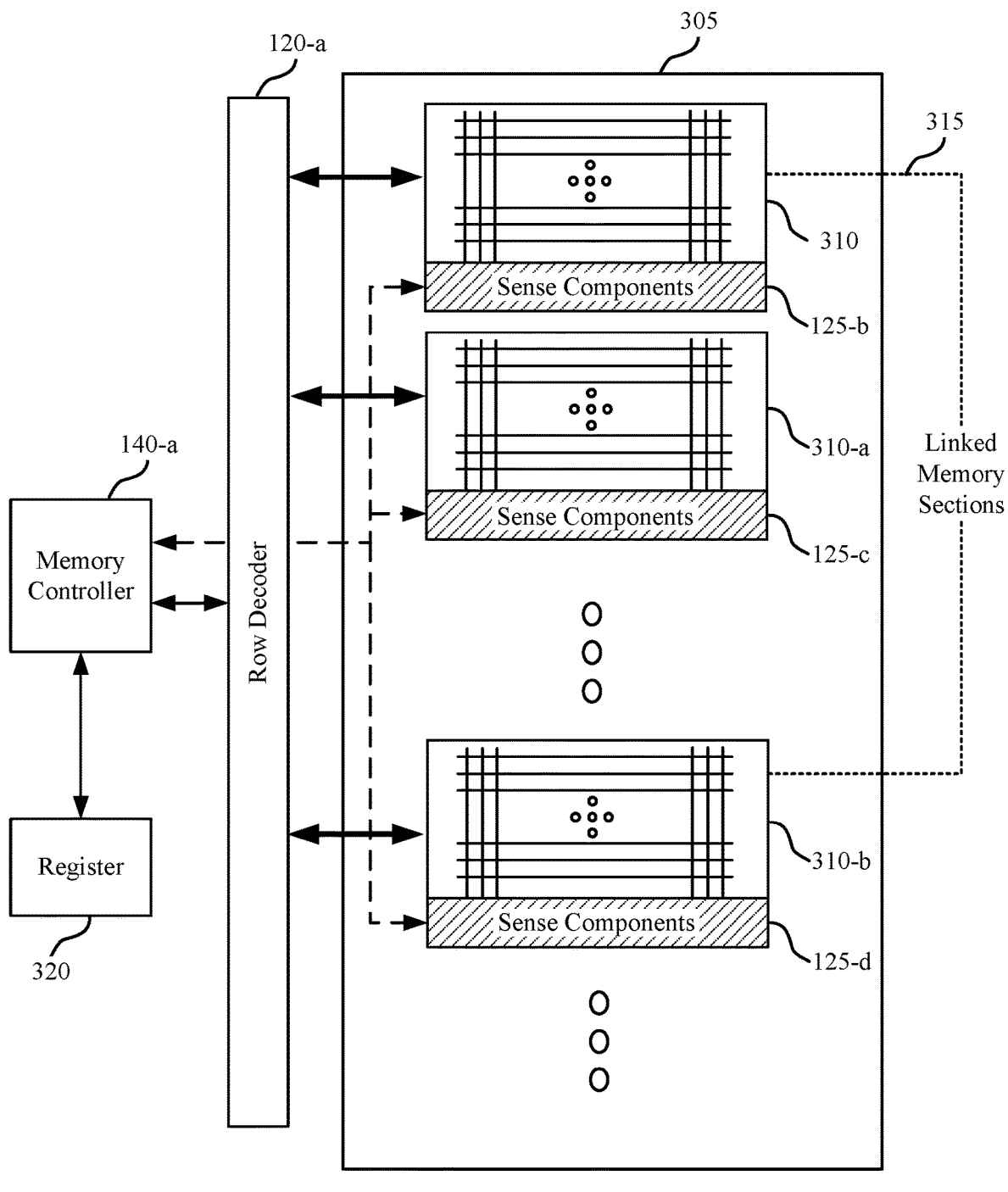
FIG. 3 illustrates an example memory array that supports a variable page size architecture in accordance with various embodiments of the present disclosure.

FIG. 3 illustrates an example memory array 100-a that supports a variable page size architecture in accordance with various embodiments of the present disclosure. Memory array 100-a includes memory bank 305, which includes memory sections 310, 310-a, and 310-b. Each memory section 310 is associated with a set of sense component 125, for example, sense components 125-b, 125-c, and 125-d, which may be examples of sense components 125 with reference to FIGS. 1-2. Memory sections 310 may be composed of rows and columns of memory cells, as described with reference to FIG. 1. Each memory section 310 is in electronic communication with row decoder 120-a, which may be an example of a row decoder 120 with reference to FIG. 1. Memory array 100-a also includes memory controller 140-a, which may be an example of a memory controller 140 with reference to FIG. 1, and register 320, which may store linking relationships among memory sections 310. For example, linking relationship 315 may represent a linking relationship between memory section 310 and 310-b.

Some volatile memory technologies have relatively large page sizes, e.g., 2 to 4 kilobytes (kB), which may be equal to the number of memory cells in a row of the array or bank. Accessing a row (e.g., activating a word line 110) containing volatile memory cells may destroy their stored logic states. So each memory cell in the row may be sensed and, in some cases, buffered as a memory page. Once a page is opened, for example with an activate command, the full page may be read and its contents are available. The column address selects which burst of data (e.g., a subset of the memory page) will be output. Subsequent column addresses may select the remaining portions of the memory page.

In the case of non-volatile memories, each memory cell of the row may not need to be sensed when accessing the row. For example, in non-volatile memories, such as ferroelectric memories or spin torque transfer memories, the selection of a certain word line 110 may not cause the loss of the content of the entire row, as in DRAM. So for non-volatile memory cells in memory array 100-a, a subset of columns (i.e., a subset of memory cells 105 within the row) may be accessed and thus it is possible to reduce the die size by providing fewer sense components 125 than the number of columns (bit lines 115) for each memory section 310 of memory bank 305. In contrast, volatile memory arrays, such as DRAM, use one sense amp per column. Thus, memory array 100-a may have a high density of memory cells while having a page size smaller than the total number of memory cells 105 in a row. So memory array 100-a may minimize power consumption and die size.

Memory bank 305 may be divided into multiple memory sections (e.g., 8, 16, 32, and so on), each with its own set of sense components 125. Each memory section 310 may have a base page size that is less than the total number of memory cells 105 within a single row. For example, memory bank 305 may be 1 gigabit (Gb) in size and may be divided into eight memory sections 310. Each memory section 310 may contain 128 megabits (Mb) and include 4096 rows of memory cells 105 and 32768 columns of memory cells 105 (i.e., 4 kB in each row). The base page size may be less than 4 kB, however. For example, it may be 128 Bytes (1024 bits or memory cells). In other words, one sense component may exist for every four column access lines (bit lines 115). The base page size may, in some examples, be fixed and depend on the number of sense components 125 in each memory section 310. These examples are some of many possible configurations, and other sizes are possible.

The page size used to access memory bank 305, i.e., the active page size, may be dynamically changed. That is, the active page size may constitute multiple base pages. Multiple memory sections 310 may be operated in parallel to create a larger page size. For example, memory section 310 and memory section 310-b may have a base page size (e.g., 128 Bytes), and a larger active page size (e.g., 256 Bytes) may be created by accessing both memory section 310 and 310-b simultaneously. More memory sections 310 may be accessed simultaneously to create even larger page sizes. Thus, one activate command may extract a larger amount of data from memory bank 305, which may increase speed and performance. For example, read commands may be issued with the same timing considerations as if a physically larger page was implemented.

The operation of memory bank 305 may include determining a first plurality of logic values in a first row of memory bank 305, determining a second plurality of logic values in a second row of memory bank 305, and buffering a memory page that includes the first plurality of logic values and the second plurality of logic values. A subset of the memory page may then be sent to a bus. For example, sense components 125-b, 125-c, and 125-d may include a row buffer to latch the determined logic values and buffering the memory page may include latching the first plurality of logic values and the second plurality of logic values. In some cases, determining the first plurality of logic values in the first row includes determining a logic state of each memory cell 105 of a subset of memory cells in the first row. In some examples, memory bank 305 includes a plurality of memory sections 310 (e.g., memory sections 310, 310-a, and 310-b), and first memory section 310 contains the first row and second memory section 310-b contains the second row.

In some examples, the base memory page size comprises the first plurality of logic values or the second plurality of logic values, and operating memory bank 305 may include determining that a size of the memory page comprises twice the base memory page size and configuring a command generator to issue activate commands based on the size of the memory page. For example, memory controller 140-a may include the command generator and may generate commands to activate the word lines 110 associated with the first and second rows.

In some examples, the active page size may be configured upon powering on of a device containing memory array 100-a. This may provide an advantage with respect to using the same die to address different needs in terms of page size. For example, the memory array may be used for applications in which one page size may be best, and another user may have a different application that may perform better with a different page size. Such a variable page size architecture may accommodate both scenarios with a single memory device.

In other examples, the active page size may be dynamically set. For example, memory controller 140-a may receive a command from a software application to use a specific page size. Or memory array 100-a may reach a predetermined temperature and use a smaller page size to decrease heat generation. With a dynamic page size, optimal use of memory array 100-a may be possible. For example, power usage may be minimized when short bursts are needed or when code is being executed and a page change occurs at a high rate. Or, a larger page size may be used in order to improve the performance (e.g., increasing the amount of data accessed per activate command).

The addressing scheme may be adjusted based on the active page size. For example, some address bits may be used both as column addresses and as row addresses, and memory controller 140-a may be aware of the size of each open page. Memory controller 140-a may also modify the addressing scheme based on the active page size. For example, the logic row address may identify a memory section 310, a row within the memory section 310 (e.g., a word line 110), and a set of columns within the row (e.g., a set of bit lines 115). Memory controller 140-a may modify the addressing scheme as the number of memory sections accessed in parallel varies with changes in page size.

During an activate command, a logic row address may be sent to the row decoder 120-a. The logic row address is a string of bits that identify specific locations within the memory bank 305. For example, with respect to the 1 Gb memory bank example previously discussed, using an active page size equal to the base page size of 1 kB, the logic row address may contain 20 bits (i.e., $2^{20}$ may be equal to the total number of base pages: 1 Gb/1024 bits/page). Three bits of the logic row address may identify one of the eight memory sections 310. These bits may be the least significant bits of the logic row address. 12 bits may identify one row of the 4096 rows within the identified memory section 310. These bits may be the most significant bits. The remaining five bits may identify the physical columns of the memory page. For example, the five bits may select a set of 1024 columns within the 32768 columns of the memory section 310. The set of columns may be grouped together, or spaced apart, including equally spaced along the row. In general, the number of bits of the logic row address can change for differently size memory arrays.

In the present example, after sensing the memory cells 105, data may be sent from memory array 100-a to a processor, for example. The data may be sent in bursts in which a subset of the memory page is sent in each burst. For illustrative purposes, the read burst length may be 256 bits (or 16 words). Thus, the 128 Bytes page contains four read burst lengths. So, memory controller 140-a may send a column address of two bits to select one of the four possible read burst lengths. For example, memory controller 140-a may be in electronic communication with sense components 125-b, 125-c, and 125-d, which may include row buffers or column decoders (e.g., column decoder 130 with reference to FIG. 1), and may send the column address to the column decoder.

If the active page size changes, the address scheme may change. For example, the active page size may be twice the base page size and two memory sections may be accessed simultaneously (e.g., memory sections 310 and 310-b). The logic row address may decrease to 19 bits from 20 bits. For example, memory sections 310 and 310-b may be linked through linking relationship 315, and the logic row address may not need to distinguish among all eight memory sections 310. The total number of bits in the page size, however, may have increased to 2048 from 1024. Thus, the number of read burst lengths may increase to eight from four, and the column address may thus be increased to three bits from two in order to choose one of the eight read burst lengths. So one bit may be moved from the logic row address to the column address such that the sum of the bits of the logic row address and the column address may remain a constant. In other examples, two logic row addresses may be sent to the row decoder 120-a to open two base memory pages to create a larger active page size.

As mentioned, the techniques described herein may be applied to various page sizes and to memory arrays, banks, or sections of various sizes. Active page sizes may be composed four, eight, sixteen, and so on base pages. Memory bank 305 may be smaller or larger than 1 Gb, and fewer or greater number of memory sections 310 may be used.

So the operation of memory bank 305 may include identifying a base page size associated with a number of memory cells of memory bank 305 for which memory array 100-a is accessible and selecting an active page size that is an integer multiple of the base page size. The operation may include configuring the address scheme for memory bank 305 based on the active page size and sending an access command using the address scheme and according to the active page size. The base page size may be a page size for each memory section 310 of the plurality of memory sections of memory array 100-*a*.

In some examples, configuring the address scheme includes configuring the logic row address to identify a memory section 310 of a plurality of memory sections of the memory array 100-*a*, a physical row within the memory section 310, and a physical column section of the physical row. For example, the physical column section may include a plurality of memory cells equal to the base page size. The physical column section may include a group of adjacent physical columns, several groups of adjacent physical columns, physical columns separated from each other, or physical columns equally spaced along the physical row.

In some examples, configuring the address scheme includes configuring a column address to identify a section of the active page size, where the active page size comprises a plurality of sections. For example, the section of the active page size may be a read burst length.

Configuring the address scheme may further include determining a number of bits for a logic row address and a column address based on the active page size. In some examples, the sum of the number of bits for the row address and the number of bits for the column address may be a constant value independent of the active page size. The constant value may be based on the size of memory bank 305 and a read burst length. For example, the total number of read burst lengths in memory bank 305 may be the size of memory bank 305 (e.g., 1 Gb) divided by the read burst length (e.g., 256 bits).

Operation of memory bank 305 may further include determining a linking relationship between a first memory section of a plurality of memory sections and a second memory section of the plurality of memory sections. For example, memory sections 310 and 310-*b* may be linked, as shown by linking relationship 315. In such a case, the active page size may be twice the base page size, and operation of memory array 100-*a* may further include sending a logic row address to a row decoder 120-*a* to open a memory page, where the logic row address identifies the first memory section 310. Row decoder 120-*a* may open a first base memory page of the first memory section 310 based on the logic row address and open a second base memory page of the second memory section 310-*b* based on linking relationship 315. The memory page may thus include the first base memory page and the second base memory page.

In some examples, the second base memory page may have a same relative address within the second memory section 310-*b* as the first base memory page within the first memory section 310. That is, the first and second base memory pages may be in the same relative row and column section of their respective memory sections.

In some examples, the linking relationships among different memory sections 310 may be stored in register 320. These linking relationships may indicate which memory sections 310 are accessible in parallel to enable larger active page sizes. In some cases, the linking relationship is configurable. For example, a user or a software application may configure the linking relationships in order to optimize the operation of memory array 100-*a*.

Selecting the active page size may include selecting the active page size upon powering on a device, where the memory array comprises an element of the device. Or, selecting the active page size may include receiving an indication to use a specific page size and setting the active page size equal to the specific page size. For example, memory controller 140-*a* may receive such an indication and set the active page size and configure the memory addressing scheme accordingly. In some examples, the indication may be received from a software application.

Memory bank 305 may be operated simultaneously with different page sizes. For example, a first page size may be used to program memory cells 105 and a second page size may be used to read or sense memory cells 105 of memory bank 305. So a first plurality of memory cells of the memory bank 305 may be programmed using the active page size and a second plurality of memory cells of memory bank 305 may be read using another active page size that is a different integer multiple of the base page size. For example, a read operation may use page size that is a submultiple of, which may be smaller than, a page size used for the write operation. Or a page sized use for a write operation may be larger than a page size used for a read operation.

In other examples, memory array 100-*a* may include multiple memory banks 305 and each memory bank 305 may be operated independently. For example, a first memory bank 305 of the plurality of memory banks may be accessed using a first memory page size, and a second memory bank of the plurality may be accessed using a second memory page size that is different from the first memory page size. Each memory bank 305 may use a different addressing scheme. For example, accessing the first memory bank 305 may include using a first addressing scheme that is based on the first memory page size and accessing the second memory bank may include using a second addressing scheme that is based on the second memory page size.

In some examples, memory bank 305 includes a plurality of memory sections 310 and each memory section 310 may have a plurality of physical rows of memory cells. Operating memory bank 305 may include receiving an access request for a memory cell 105 in the memory bank, identifying a memory section 310 of the plurality of memory sections of the memory bank in which the memory cell 105 is located, identifying, in the memory section 310, a physical row of the plurality of physical rows of memory cells that contains the memory cell 105, identifying, in the physical row, a memory page that contains the memory cell, and generating a logic row address to open the memory page.

In some cases, the memory cell may be located in a second memory section 310-*b*, and the second memory section 310-*b* is linked to the first memory section 310. In such cases, generating the logic row address may include generating the logic row address that identifies the first memory section and sending the logic row address to row decoder 120-*a* in which the physical row of the second memory section is accessible by row decoder 120-*a* based on the logic row address identifying the first memory section and the linking between the first memory section and the second memory section.

Figure 4:
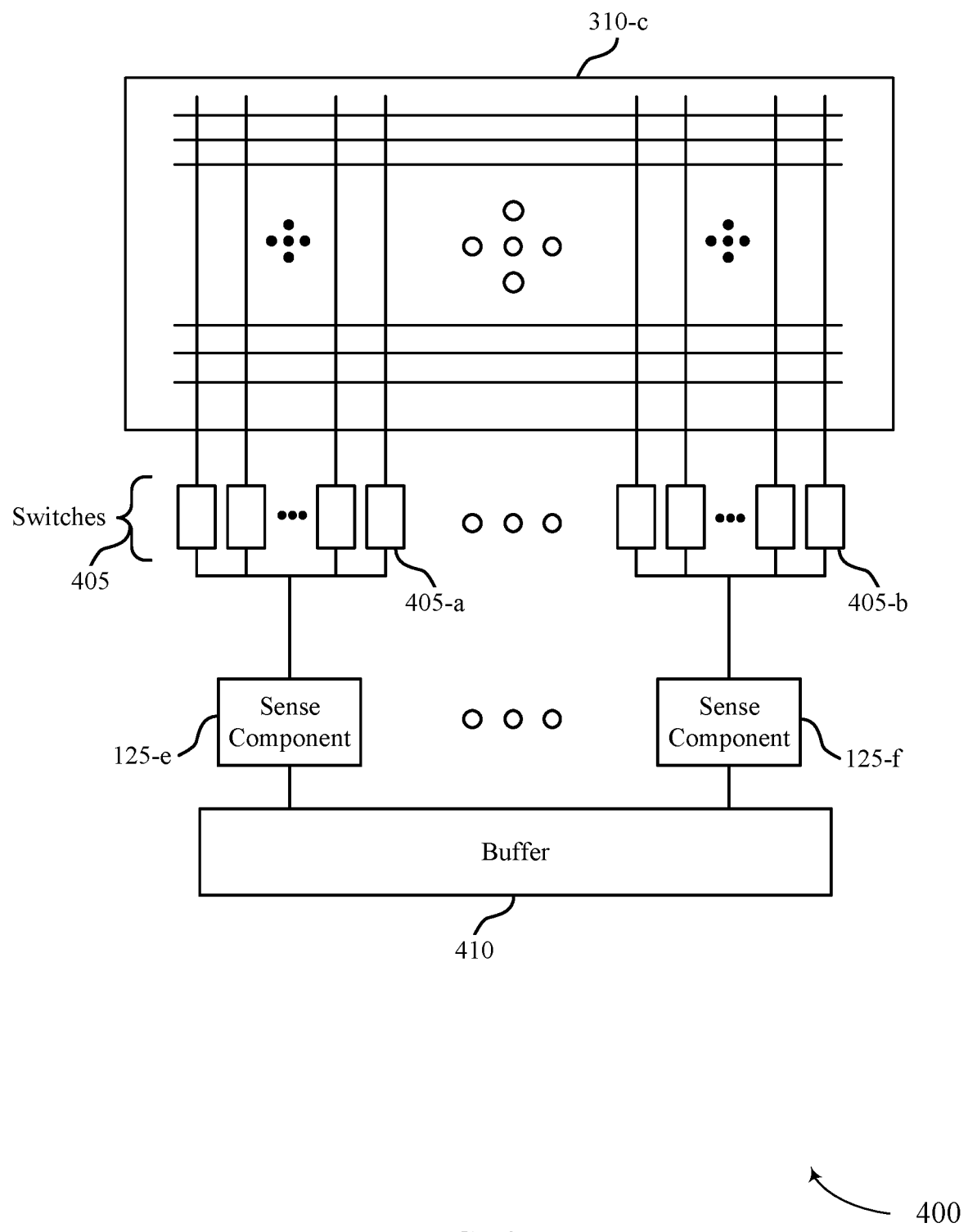
FIG. 4 illustrates an example circuit of a memory array that supports a variable page size architecture in accordance with various embodiments of the present disclosure.

FIG. 4 illustrates an example circuit 400 that supports a variable page size architecture in accordance with various embodiments of the present disclosure. Circuit 400 includes memory section 310-*c*, which may be an example of a memory section 310 with reference to FIG. 3. Circuit 400 also includes sense components 125-*e* and 125-*f*, which may be examples of a sense component 125 with reference to FIGS. 1-3. Sense components 125 may be in electronic communication with multiple columns (e.g., digit lines 115) of memory section 310-*c*, and switches 405 may control which column is connected to a sense component 125 during access operations. Buffer 410, which is also part of circuit 400, may buffer the sensed logic values of memory cells 105 within memory section 310-*c*.

Memory section 310-c may include multiple rows and columns of memory cells 105. As described above, each memory cell 105 of the row may not be sensed when a row is accessed. Thus, a subset of columns (i.e., a subset of memory cells 105 within the row) may be selected and thus it is possible to reduce the die size by simply providing fewer sense amps than the number of columns in each memory section 310 of a memory bank 305. Switches 405 may control which subset of columns are selected during an access operation. In some examples, switches 405 may be transistors, such as n-type or p-type field-effect transistors, and may be activated by applying a threshold voltage to them.

So circuit 400 may include a plurality of row access lines in which each row access line of the plurality is in electronic communication with a row of memory cells and a plurality of column access lines in which each column access line of the plurality is in electronic communication with a column of memory cells. Circuit 400 may also include a plurality of sense components 125, where a number of sense components is less than a number of column access lines. For example, sense component 125-e is in electronic communication with at least two column access lines. In some examples, a memory controller is configurable to select a memory page size from a plurality of memory page sizes in which a smallest page size of the plurality of page sizes is based on the number of sense components 125. For example, the smallest page size may be equal to the number of sense components 125 contained in memory section 310-c.

Circuit 400 may include a plurality of switches, and each switch of the plurality of switches may be electrically separating a column access line of the plurality of column access lines from a sense component of the plurality of sense components. For example, switch 405-a separates a column access line from sense component 125-e, and switch 405-b separates another column access line from sense component 125-f. Circuit 400 also includes a row buffer that may include a plurality of latches, and each latch of the plurality of latches is in electronic communication with a sense component of the plurality of sense components.

Memory section 310-c may be one of multiple memory sections 310 within a memory bank 305. That is, a plurality of memory sections 310 may comprise a memory bank 305, and each memory section 310 of the plurality of memory sections is associated with a set of sense components 125. In some examples, circuit 400 may include a command generator configurable to issue a logic row address based on the memory page size. For example, the command generator may be part of a memory controller 140.

The operation of circuit 400 may include identifying a page size from a plurality of page sizes in which the memory array (e.g., a memory array 100 of which memory section 310-c is a part of) is accessible and accessing at least one row of the memory array based on the identified page size. In some examples, identifying a page size may include identifying two or more rows of the memory array. Operation of circuit 400 may further include accessing the row, which may include electronically coupling each memory cell 105 of the row to an access line (e.g., a digit line 115). For example, a word line 110 may be accessed in which each memory cell 105 in electronic communication with the word line 110 is electronically coupled to a digit line 115. In other words, accessing the row of the memory array may include activating a plurality of selection components 220 in which each memory cell of the row is in electronic communication with a selection component 220 of the plurality of selection components 220. Operation of circuit 400 may further include selecting a subset of memory cells 105 of the row via a subset of access lines and a logic value of each memory cell 105 of the subset of memory cells 105 may be determined.

In some examples, selecting the subset of memory cells 105 of the row via the subset of access lines includes activating a first plurality of switches 405 to electronically couple each access line of the subset of access lines to a sense component of a plurality of sense components 125. For example, switch 405-a and 405-b may be activated to electronically couple one column access line to sense component 125-e and 125-f, respectively. The remainder of access lines may be electrically isolated from the plurality of sense components via a second plurality of switches—that is, the switches other than 405-a and 405-b. In some examples, a logic row address that identifies the subset of memory cells may be received and the first plurality of switches may be activated based on the logic row address.

Figure 5:
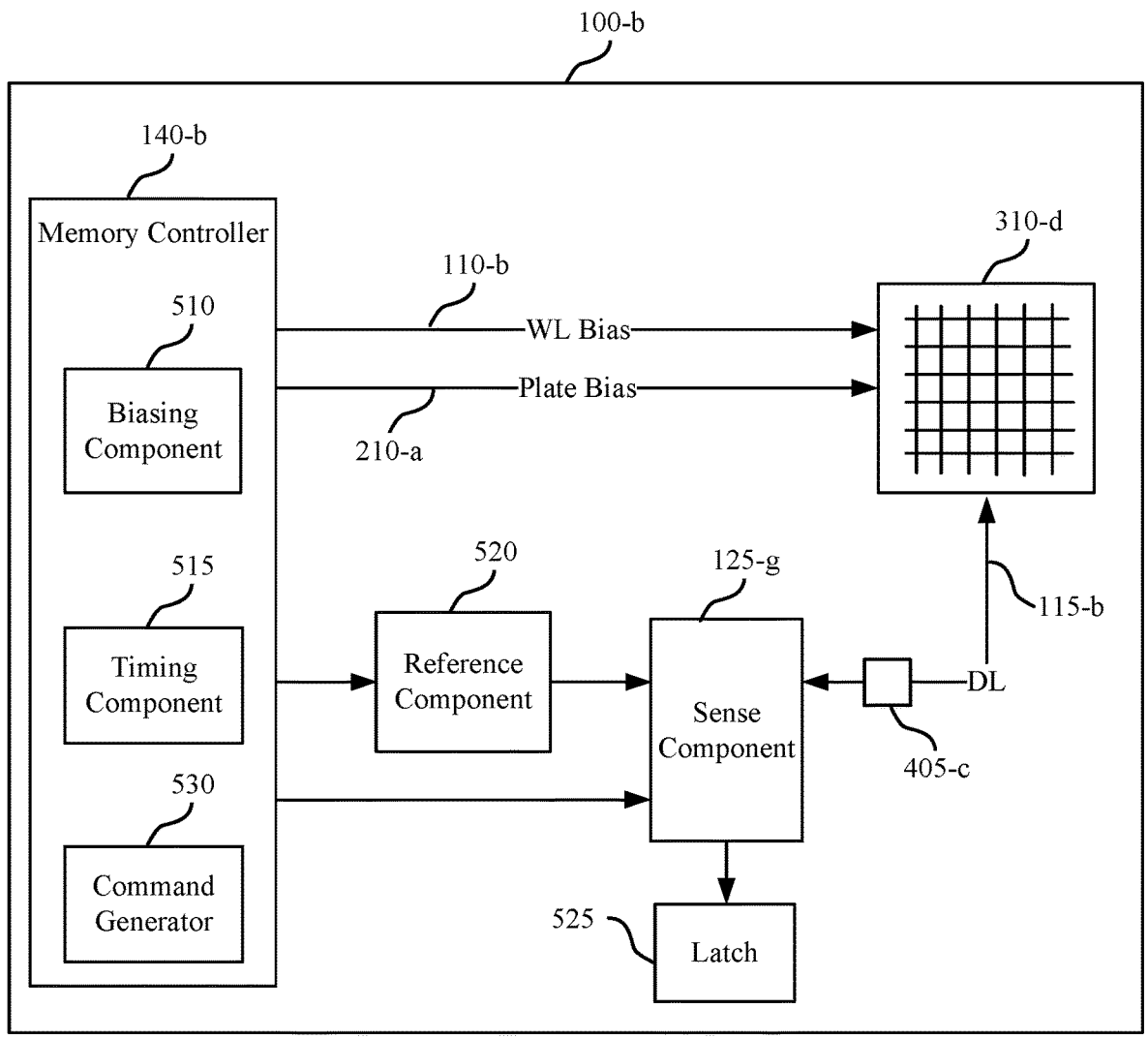
FIG. 5 illustrates a block diagram of an example memory array that supports a variable page size architecture in accordance with various embodiments of the present disclosure.

FIG. 5 shows a block diagram 500 of a memory array 100-b that supports a variable page size architecture in accordance with various embodiments of the present disclosure. Memory array 100-b may be referred to as an electronic memory apparatus and includes memory controller 140-b and memory section 310-d, which may be examples of memory controller 140 and a memory section 310 as described with reference to FIGS. 1-4. Memory controller 140-b may include biasing component 510, timing component 515, and command generator 530 and may operate memory array 100-b as described in FIGS. 1-4. Memory controller 140-b may be in electronic communication with word line 110-b, digit line 115-b, sense component 125-g, and plate line 210-a, which may be examples of word line 110, digit line 115, sense component 125, and plate line 210 described with reference to FIG. 1 or 2. Memory array 100-b may include switch 405-c, which may be an example of a switch 405 with reference to FIG. 4. Memory array 100-b also includes reference component 520 and latch 525. The components of memory array 100-b may be in electronic communication with each other and may perform the functions described with reference to FIGS. 1-4. In some cases, reference component 520, sense component 125-g and latch 525 may be components of memory controller 140-b.

Memory controller 140-b may be configured to activate word line 110-b, plate line 210-a, or digit line 115-b by applying voltages to those various nodes. For example, biasing component 510 may be configured to apply a voltage to read or write a memory cell 105 within memory section 310-d as described above. In some cases, memory controller 140-b may include a row decoder, column decoder, or both, as described with reference to FIG. 1 or 3. This may enable memory controller 140-b to access one or more memory cells 105. For example, a row decoder may access two rows of memory cells based on receiving a logic row address. Biasing component 510 may also provide voltage potentials to reference component 520 in order to generate a reference signal for sense component 125-g. Additionally, biasing component 510 may provide voltage potentials for the operation of sense component 125-g. Memory controller 140-b may also activate switch 405-c in order to connect a column access line of memory section 310-d to sense component 125-g.

In some cases, memory controller 140-b may perform its operations using timing component 515. For example, timing component 515 may control the timing of the various word line selections or plate biasing, including timing for switching and voltage application to perform the memory functions, such as reading and writing, discussed herein. In some cases, timing component 515 may control the operations of biasing component 510. Command generator 530 may create various commands to operate memory array 100-*b*. For example, command generator 530 may create logic row addresses as described with reference to FIGS. 1 and 3.

Reference component 520 may include various components to generate a reference signal for sense component 125-*g*. Reference component 520 may include circuitry configured to produce a reference signal. In some cases, reference component 520 may be other memory cells 105. In some examples, reference component 520 may be configured to output a voltage with a value between the two sense voltages, as described above. Or reference component 520 may be designed to output a virtual ground voltage (i.e., approximately 0V).

Sense component 125-*g* may compare a signal from a memory cell 105 (through digit line 115-*b*) to a reference signal from reference component 520. Upon determining the logic state, the sense component may then store the output in latch 525, where it may be used in accordance with the operations of an electronic device that memory array 100-*b* is a part. For example, memory array 100-*b* may receive a column address and the stored logic state in latch 525 may be sent from memory array 100-*b*, for example, to a bus.

Figure 6:
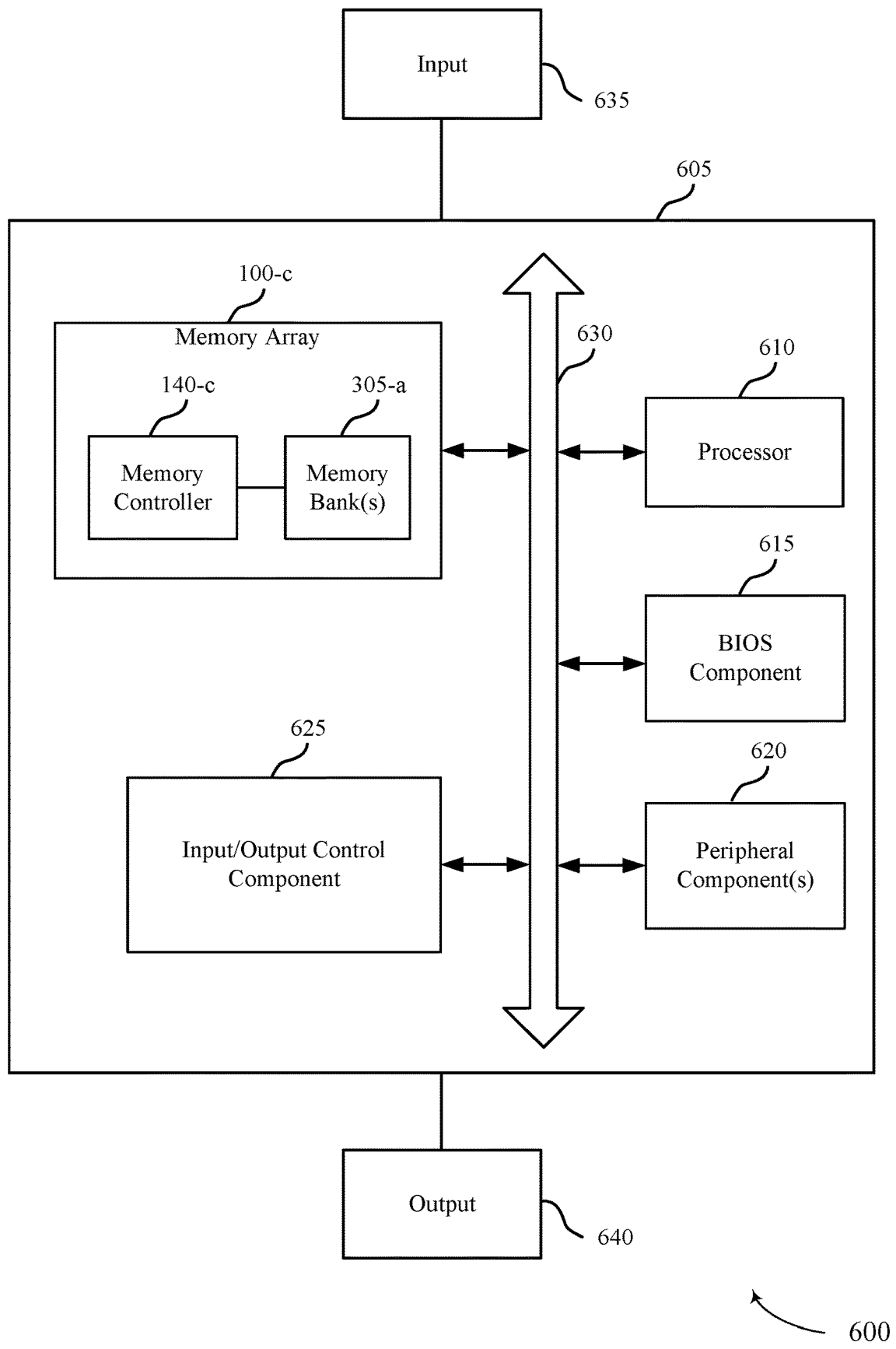
FIG. 6 illustrates a system, including a memory array, that supports a variable page size architecture in accordance with various embodiments of the present disclosure.

FIG. 6 illustrates a system 600 that supports a memory device with a variable page size architecture in accordance with various embodiments of the present disclosure. System 600 includes a device 605, which may be or include a printed circuit board to connect or physically support various components. Device 605 includes a memory array 100-*c*, which may be an example of memory array 100 described with reference to FIGS. 1, 3, and 5. Memory array 100-*c* may contain memory controller 140-*c* and memory bank(s) 305-*a*, which may be examples of memory controller 140 described with reference to FIGS. 1, 3, and 5 and a memory bank 305 described with reference to FIG. 3. Device 605 may also include a processor 610, BIOS component 615, peripheral component(s) 620, and input/output control component 625. The components of device 605 may be in electronic communication with one another through bus 630.

Processor 610 may be configured to operate memory array 100-*c* through memory controller 140-*c*. In some cases, processor 610 may perform the functions of memory controller 140 described with reference to FIGS. 1, 3, and 5. In other cases, memory controller 140-*c* may be integrated into processor 610. Processor 610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 610 may perform various functions described herein, including selecting an active page size, configuring an addressing scheme, and opening memory pages. Data from the memory page may be sent to processor 610 through bus 630. For example, a read burst may send a subset of the memory page to processor 610. Processor 610 may, for example, be configured to execute computer-readable instructions stored in memory array 100-*c* to cause device 605 perform various functions or tasks.

BIOS component 615 may be a software component that includes a basic input/output system (BIOS) operated as firmware, which may initialize and run various hardware components of system 600. BIOS component 615 may also manage data flow between processor 610 and the various components, e.g., peripheral components 620, input/output control component 625, etc. BIOS component 615 may include a program or software stored in read-only memory (ROM), flash memory, or any other non-volatile memory.

Peripheral component(s) 620 may be any input or output device, or an interface for such devices, that is integrated into device 605. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 625 may manage data communication between processor 610 and peripheral component(s) 620, input 635 devices, or output 640 devices. Input/output control component 625 may also manage peripherals not integrated into device 605. In some cases, input/output control component 625 may represent a physical connection or port to the external peripheral.

Input 635 may represent a device or signal external to device 605 that provides input to device 605 or its components. This may include a user interface or interface with or between other devices. In some cases, input 635 may be a peripheral that interfaces with device 605 via peripheral component(s) 620 or may be managed by input/output control component 625. Input 635 may include an indication for memory array 100-*c* to use a certain page size.

Output 640 may represent a device or signal external to device 605 configured to receive output from device 605 or any of its components. Examples of output 640 may include a display, audio speakers, a printing device, another processor or printed circuit board, etc. In some cases, output 640 may be a peripheral that interfaces with device 605 via peripheral component(s) 620 or may be managed by input/output control component 625.

The components of memory controller 140-*c*, device 605, and memory array 100-*c* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 7:
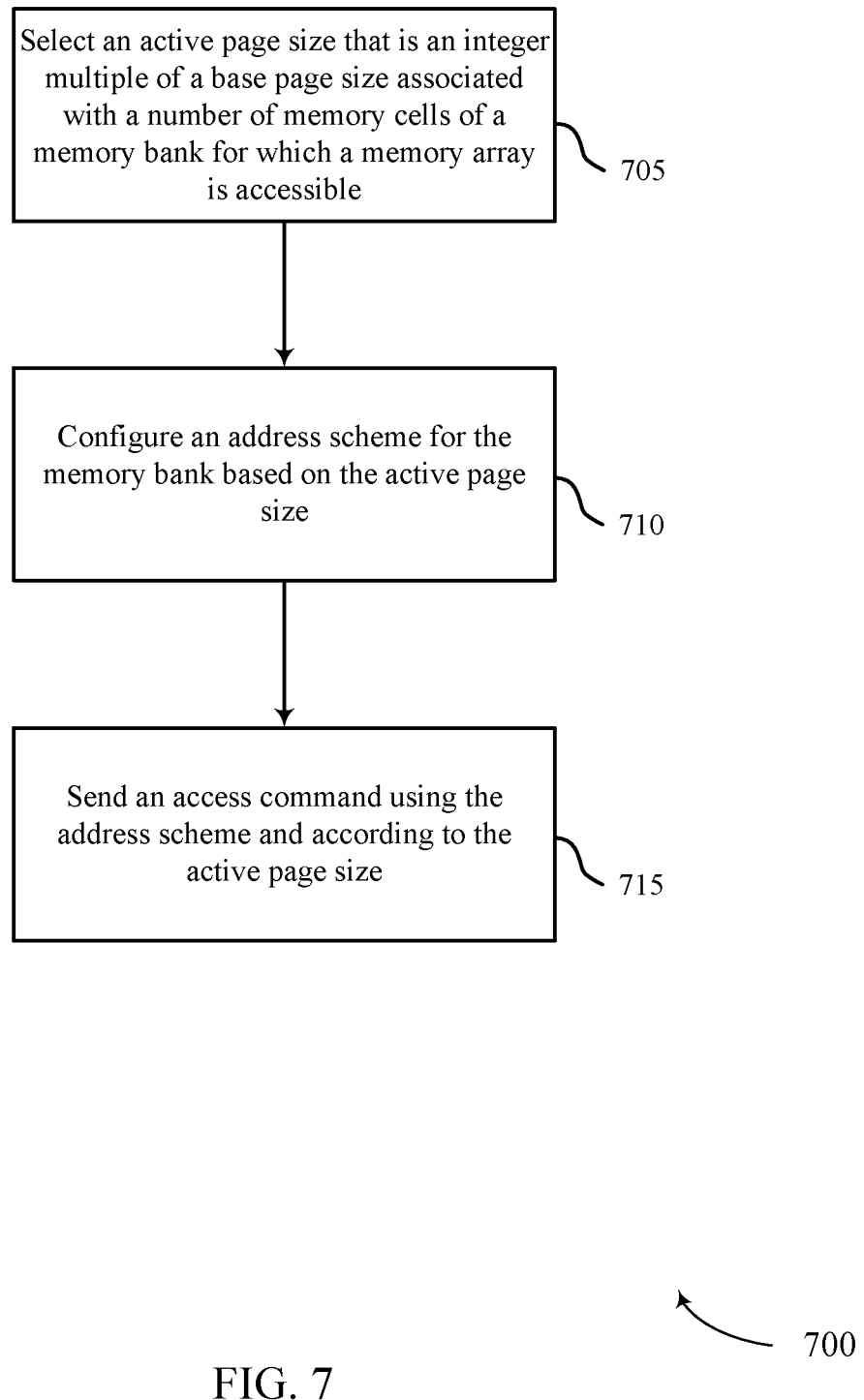
FIGS. 7-11 are flowcharts that illustrate a method or methods for operating a memory array with a variable page size architecture in accordance with various embodiments of the present disclosure.

FIG. 7 shows a flowchart illustrating a method 700 for operating a memory array with a variable page size architecture in accordance with various embodiments of the present disclosure. The operations of method 700 may be implemented by a memory array 100 or a memory bank 305, as described with reference to FIG. 1, 3, or 5. For example, the operations of method 700 may be performed by a memory controller 140 as described with reference to FIG. 1, 3, 5, or 6. In some examples, a memory controller 140 may execute a set of codes to control the functional elements of the memory array 100 to perform the functions described below. Additionally or alternatively, the memory controller 140 may perform features the functions described below using special-purpose hardware.

At block 705, the method may include selecting an active page size that is an integer multiple of a base page size that is associated with a number of memory cells of a memory bank for which a memory array is accessible as described with reference to FIGS. 1, 3, and 4. In some examples, the method may include identifying the base page size. In some examples, the base page size is a page size for each memory section of a plurality of memory sections of the memory array. In certain examples, the operations of block 705 may be performed or facilitated by the memory controller 140, as described with reference to FIG. 1, 3, 5, or 6.

At block 710, the method may include configuring an address scheme for the memory bank based on the active page size, as described with reference to FIGS. 1 and 3. In certain examples, the operations of block 710 may be performed or facilitated by the memory controller 140, as described with reference to FIG. 1, 3, 5, or 6.

At block 715, the method may include sending an access command using the address scheme and according to the active page size, as described with reference to FIGS. 1 and 3. In certain examples, the operations of block 715 may be performed or facilitated by the memory controller 140, as described with reference to FIG. 1, 3, 5, or 6.

In some examples of the method, configuring the address scheme includes configuring a logic row address to identify a memory section of a plurality of memory sections of the memory array, a physical row within the memory section, and a physical column section of the physical row. In some cases, the physical column section comprises a plurality of memory cells equal to the base page size. The physical column section may also include a plurality of physical columns equally spaced along the physical row. Configuring the address scheme may also include configuring a column address to identify a section of the active page size, wherein the active page size comprises a plurality of sections. In some examples, the section of the active page size comprises a read burst length.

In some examples, configuring the address scheme includes determining a number of bits for a logic row address based on the active page size and determining a number of bits for a column address based on the active page size. In some cases, a sum of the number of bits for the row address and the number of bits for the column address is a constant value independent of the active page size. The constant value may, in some examples, be based on a size of the memory bank and the read burst length.

The method may also include determining a linking relationship between a first memory section of the plurality of memory sections and a second memory section of the plurality of memory sections. In some examples, the first memory section may be linked to the second memory section, and the active page size may be twice the base page size. In such examples, the method may include sending a logic row address to a row decoder to open a memory page, in which the logic row address identifies the first memory section, opening a first base memory page of the first memory section based on the logic row address, and opening a second base memory page of the second memory section based on a linking between the first memory section and the second memory section, where the memory page comprises the first base memory page and the second base memory page. In some examples, the second base memory page has a same relative address within the second memory section as the first base memory page within the first memory section. In some examples of the method, the linking relationship is stored in a register and may also be configurable.

In some examples of the method, selecting the active page size may include selecting the active page size upon powering on a device in which the memory array comprises an element of the device. Or, selecting the active page size may include receiving an indication to use a specific page size and setting the active page size equal to the specific page size. In some cases, the indication to use the specific page size is received from a software application. In some cases, the page size may be a power of 2 multiple of the base page size.

The method may also include programming a first plurality of memory cells of the memory bank using the active page size and reading a second plurality of memory cells of the memory bank using another active page size that is a different integer multiple or submultiple of the base page size. For example, using another active page size that is a different submultiple of the base page size may be used during a write operation, and the other page size used during the write operation may be larger than the active page sized used the read operation.

Figure 8:
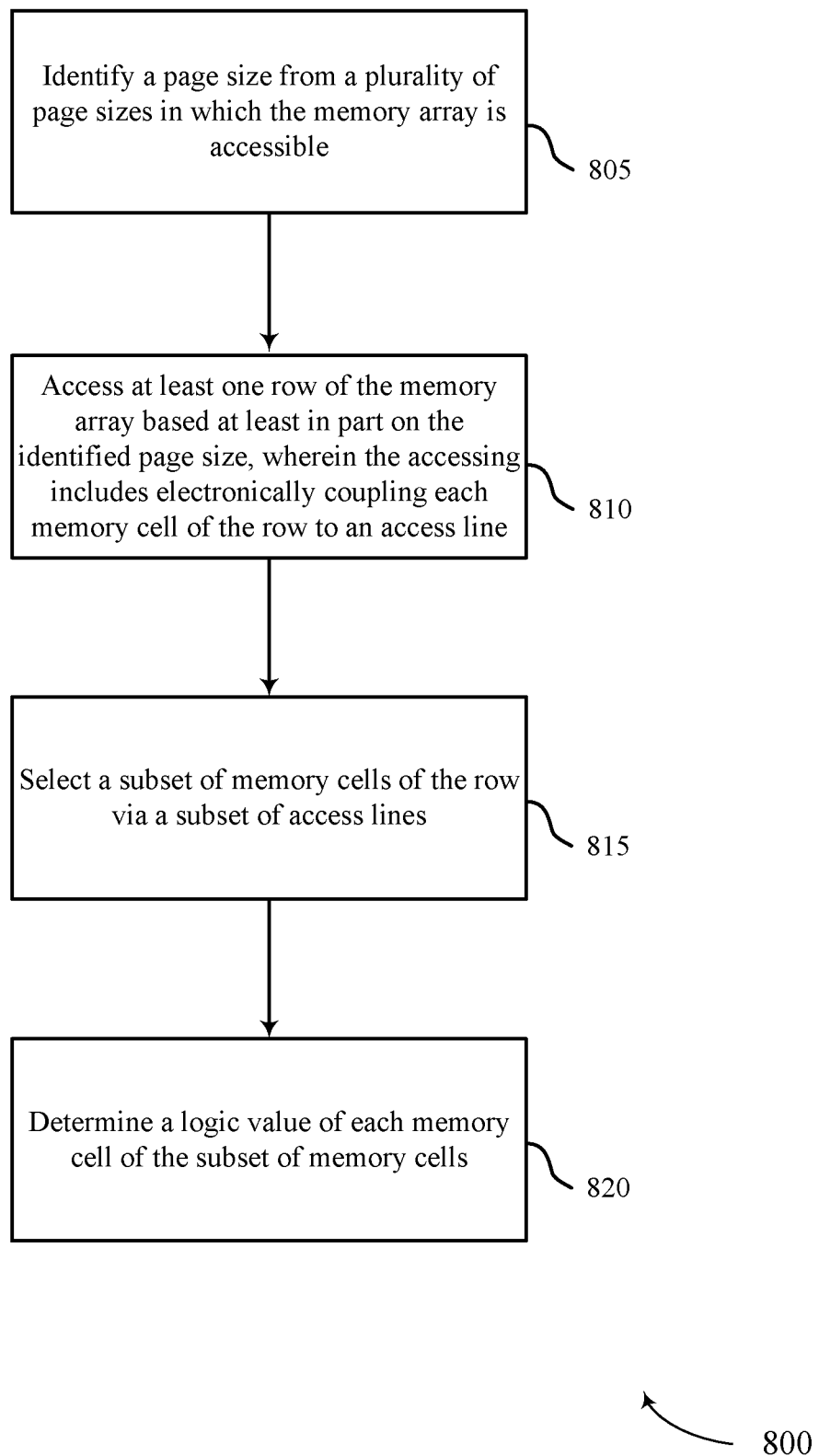

FIG. 8 shows a flowchart illustrating a method 800 for operating a memory array with a variable page size architecture in accordance with various embodiments of the present disclosure. The operations of method 800 may be implemented by a memory array 100 or a memory bank 305, as described with reference to FIG. 1, 3, or 5. For example, the operations of method 800 may be performed by a memory controller 140 as described with reference to FIG. 1, 3, 5, or 6. In some examples, a memory controller 140 may execute a set of codes to control the functional elements of the memory array 100 to perform the functions described below. Additionally or alternatively, the memory controller 140 may perform features the functions described below using special-purpose hardware.

At block 805, the method may include identifying a page size from a plurality of page sizes in which the memory array is accessible, as described with reference to FIGS. 1 and 3. In some examples, identifying the page size comprises identifying a page size that includes two or more rows of the memory array. In certain examples, the operations of block 805 may be performed or facilitated by the memory controller 140, as described with reference to FIG. 1, 3, 5, or 6.

At block 810, the method may include accessing at least one row of the memory array based on the identified page size, wherein the accessing includes electronically coupling each memory cell of the row to an access line, as described with reference to FIGS. 1, 3, and 4. In some examples, accessing the row of the memory array includes activating a plurality of selection components in which each memory cell of the row is in electronic communication with a selection component of the plurality of selection components. In certain examples, the operations of block 810 may be performed or facilitated by the memory controller 140, as described with reference to FIG. 1, 3, 5, or 6.

At block 815, the method may include selecting a subset of memory cells of the row via a subset of access lines, as described with reference to FIGS. 1, 3, and 4. In some examples, selecting the subset of memory cells of the row via the subset of access lines may include activating a first plurality of switches to electronically couple each access line of the subset of access lines to a sense component of a plurality of sense components. In some cases, a remainder of access lines is electrically isolated from the plurality of sense components via a second plurality of switches. In certain examples, the operations of block 815 may be performed or facilitated by the memory controller 140, as described with reference to FIG. 1, 3, 5, or 6.

At block 820, the method may include determining a logic value of each memory cell of the subset of memory cells, as described with reference to FIGS. 1, 3, and 4. In certain examples, the operations of block 820 may be performed or facilitated by the memory controller 140, as described with reference to FIG. 1, 3, 5, or 6.

Some examples of the method may include receiving a logic row address that identifies the subset of memory cells and activating the first plurality of switches based on the logic row address.

Figure 9:
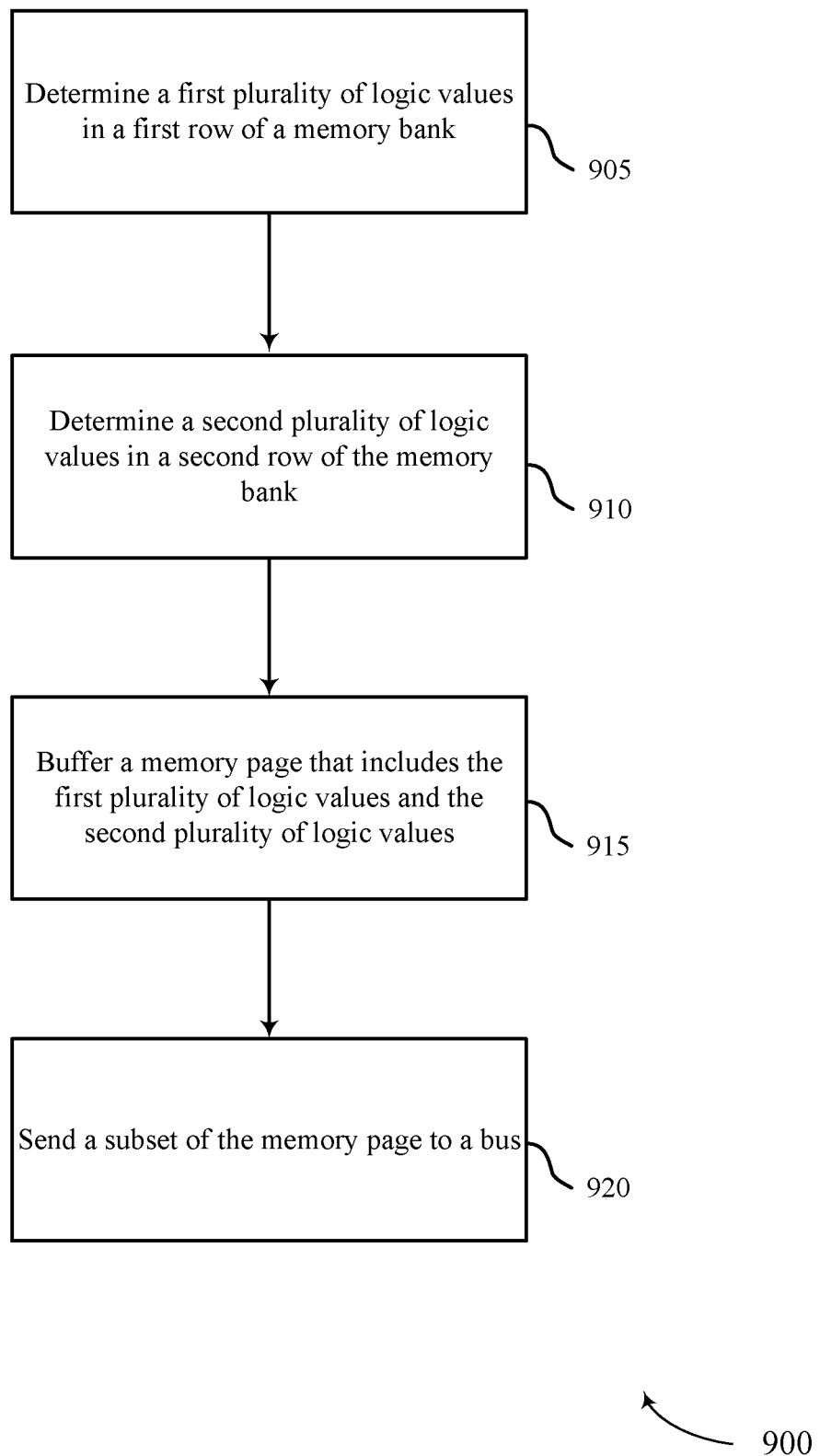

FIG. 9 shows a flowchart illustrating a method 900 for operating a memory array with a variable page size architecture in accordance with various embodiments of the present disclosure. The operations of method 900 may be implemented by a memory array 100 or memory bank 305, as described with reference to FIG. 1, 3, or 5. For example, the operations of method 900 may be performed by a memory controller 140 as described with reference to FIG. 1, 3, 5, or 6. In some examples, a memory controller 140 may execute a set of codes to control the functional elements of the memory array 100 to perform the functions described below. Additionally or alternatively, the memory controller 140 may perform features the functions described below using special-purpose hardware.

At block 905, the method may include determining a first plurality of logic values in a first row of a memory bank, as described with reference to FIGS. 1, 3, and 4. In some examples, determining the first plurality of logic values in the first row includes determining a logic state of each memory cell of a subset of memory cells in the first row. In certain examples, the operations of block 905 may be performed or facilitated by the memory controller 140, as described with reference to FIG. 1, 3, 5, or 6, sense components 125 as described with reference to FIGS. 1-5, or switches 405 as described with reference to FIG. 4.

At block 910, the method may include determining a second plurality of logic values in a second row of the memory bank, as described with reference to FIGS. 1, 3, and 4. In some examples, determining the second plurality of logic values in the second row includes determining a logic state of each memory cell of a subset of memory cells in the second row. In certain examples, the operations of block 910 may be performed or facilitated by the memory controller 140, as described with reference to FIG. 1, 3, 5, or 6, sense components 125 as described with reference to FIGS. 1-5, or switches 405 as described with reference to FIG. 4.

At block 915, the method may include buffering a memory page that includes the first plurality of logic values and the second plurality of logic values, as described with reference to FIGS. 1, 3, and 4. In some examples, buffering the memory page includes latching the first plurality of logic values and the second plurality of logic values. In certain examples, the operations of block 915 may be performed or facilitated by the memory controller 140, as described with reference to FIG. 1, 3, 5, or 6 or a buffer 410 as described with reference to FIG. 4.

At block 920, the method may include sending a subset of the memory page to a bus, as described with reference to FIGS. 1, 3, 4, and 6. In certain examples, the operations of block 920 may be performed or facilitated by the memory controller 140, as described with reference to FIG. 1, 3, 5, or 6 or bus 630 as described with reference to FIG. 6.

In some examples of the method, the memory bank includes a plurality of memory sections, and a first memory section comprises the first row and a second memory section comprises the second row.

In some examples of the method in which a base memory page size comprises the first plurality of logic values or the second plurality of logic values, the method may include determining that a size of the memory page comprises twice the base memory page size and configuring a command generator to issue activate commands based on the size of the memory page.

Figure 10:
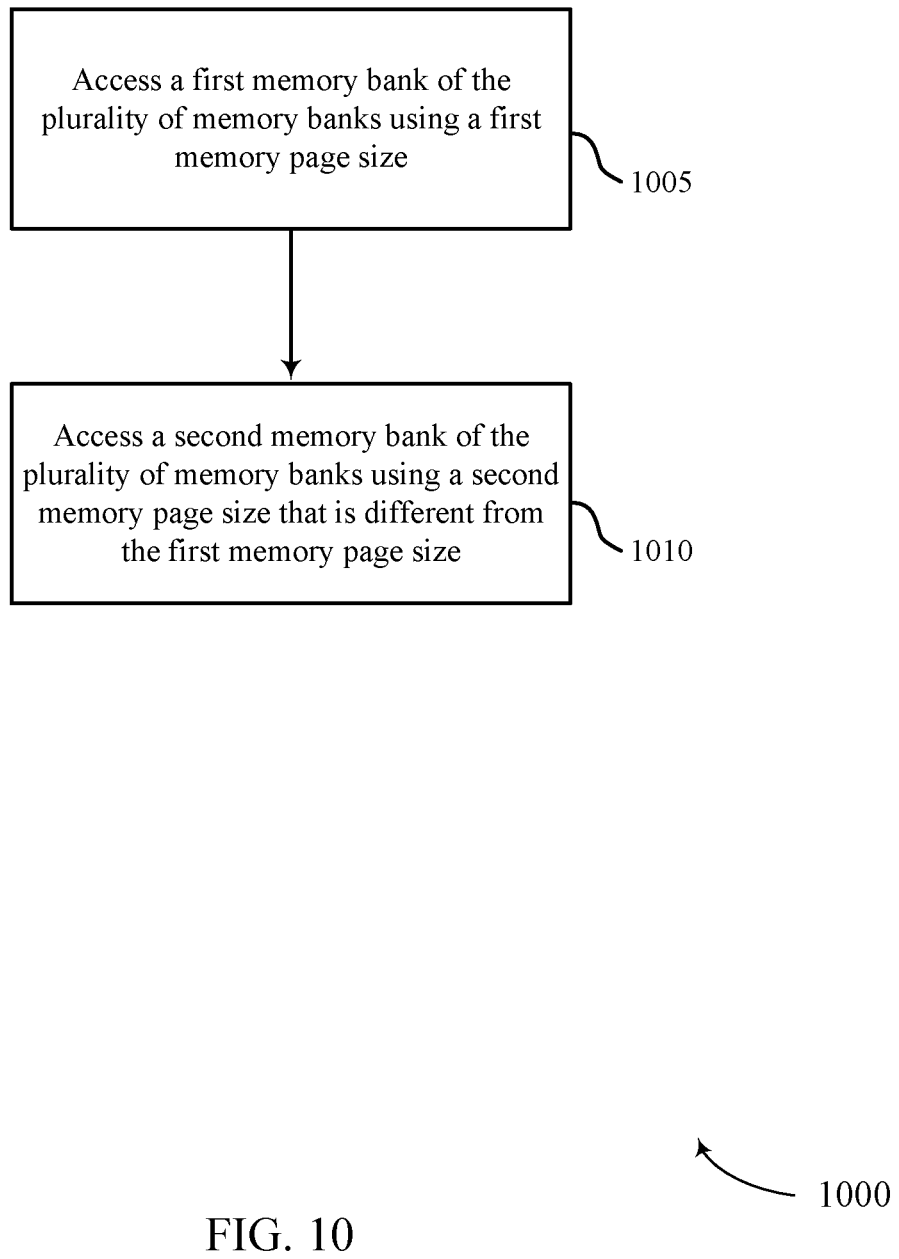

FIG. 10 shows a flowchart illustrating a method 1000 for operating a memory array with a variable page size architecture in accordance with various embodiments of the present disclosure. The operations of method 1000 may be implemented by a memory array 100 or memory bank 305, as described with reference to FIG. 1, 3, or 5. For example, the operations of method 1000 may be performed by a memory controller 140 as described with reference to FIG. 1, 3, 5, or 6. In some examples, a memory controller 140 may execute a set of codes to control the functional elements of the memory array 100 to perform the functions described below. Additionally or alternatively, the memory controller 140 may perform features the functions described below using special-purpose hardware.

At block 1005, the method may include accessing a first memory bank of the plurality of memory banks using a first memory page size, as described with reference to FIGS. 1 and 3. In certain examples, the operations of block 1005 may be performed or facilitated by the memory controller 140, as described with reference to FIG. 1, 3, 5, or 6.

At block 1010, the method may include accessing a second memory bank of the plurality of memory banks using a second memory page size that is different from the first memory page size, as described with reference to FIGS. 1 and 3. In certain examples, the operations of block 1010 may be performed or facilitated by the memory controller 140, as described with reference to FIG. 1, 3, 5, or 6.

In some examples, the method may include accessing the first memory bank using a first addressing scheme that is based on the first memory page size and accessing the second memory bank using a second addressing scheme that is based on the second memory page size.

Figure 11:
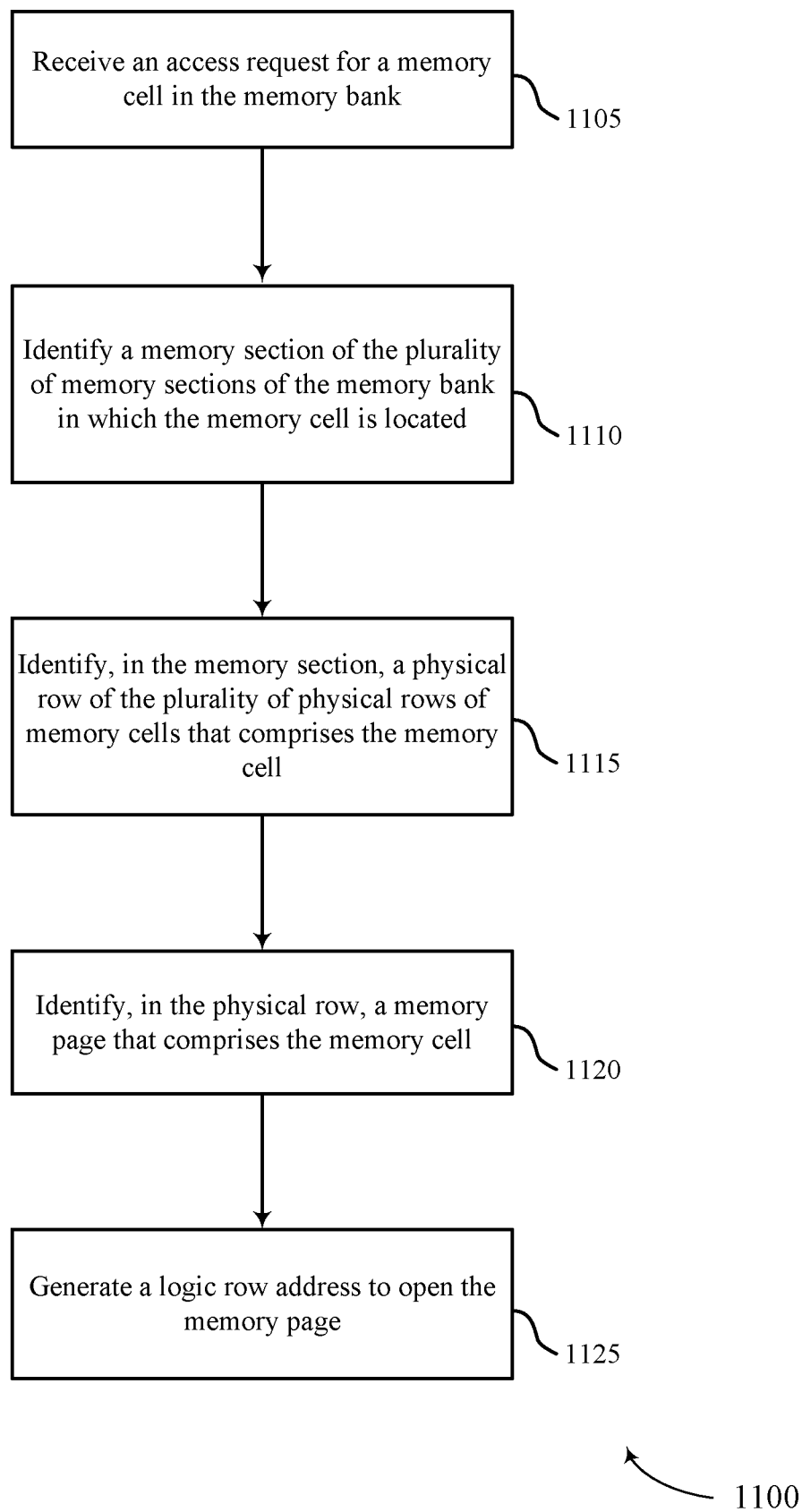

FIG. 11 shows a flowchart illustrating a method 1100 for operating a memory array with a variable page size architecture in accordance with various embodiments of the present disclosure. The operations of method 1100 may be implemented by a memory array 100 or a memory bank 305, as described with reference to FIG. 1, 3, or 5. For example, the operations of method 1100 may be performed by a memory controller 140 as described with reference to FIG. 1, 3, 5, or 6. In some examples, a memory controller 140 may execute a set of codes to control the functional elements of the memory array 100 to perform the functions described below. Additionally or alternatively, the memory controller 140 may perform features the functions described below using special-purpose hardware. Method 1100 may include operating a memory bank of a memory array that includes a plurality of memory sections, each memory section having a plurality of physical rows of memory cells.

At block 1105, the method may include receiving an access request for a memory cell in the memory bank, as described with reference to FIGS. 1, 3, and 4. In certain examples, the operations of block 1105 may be performed or facilitated by the memory controller 140, as described with reference to FIG. 1, 3, 5, or 6.

At block 1110, the method may include identifying a memory section of the plurality of memory sections of the memory bank in which the memory cell is located, as described with reference to FIGS. 1, 3, and 4. In certain examples, the operations of block 1110 may be performed or facilitated by the memory controller 140, as described with reference to FIG. 1, 3, 5, or 6.

At block 1115, the method may include identifying, in the memory section, a physical row of the plurality of physical rows of memory cells that comprises the memory cell, as described with reference to FIGS. 1, 3, and 4. In certain examples, the operations of block 1115 may be performed or facilitated by the memory controller 140, as described with reference to FIG. 1, 3, 5, or 6.

At block 1120, the method may include identifying, in the physical row, a memory page that comprises the memory cell, as described with reference to FIGS. 1, 3, and 4. In certain examples, the operations of block 1120 may be performed or facilitated by the memory controller 140, as described with reference to FIG. 1, 3, 5, or 6.

At block 1125, the method may include generating a logic row address to open the memory page, as described with reference to FIGS. 1, 3, and 4. In certain examples, the operations of block 1125 may be performed or facilitated by the memory controller 140, as described with reference to FIG. 1, 3, 5, or 6 or the command generator as described with reference to FIG. 5.

In some examples of the method, the memory cell may be located in a second memory section and the second memory section is linked to a first memory section. In such cases, generating the logic row address may include generating the logic row address that identifies the first memory section and sending the logic row address to a row decoder, wherein the physical row of the second memory section is accessible by the row decoder based on the logic row address identifying the first memory section and the linking between the first memory section and the second memory section.

Thus, methods 700, 800, 900, 1000, and 1100 may provide for operating a memory array with a variable page architecture. It should be noted that methods 700, 800, 900, 1000, and 1100 describe possible implementations, and the operations and steps may be rearranged or otherwise modified such that other implementations are possible. In some examples, features from two or more of the methods 700, 800, 900, 1000, and 1100 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The term "couple" refers to a relationship between connected components. Components that are coupled are connected to and may communicate or transfer signals between each other. For example, a switch may couple components when the switch creates a closed circuit such that electrical current may flow between the components.

The memory devices discussed herein may include a ferroelectric material, which is characterized by a spontaneous electric polarization, i.e., it maintains a non-zero electric polarization in the absence of an electric field. Example ferroelectric materials include barium titanate (BaTiO$_3$), lead titanate (PbTiO$_3$), lead zirconium titanate (PZT), and strontium bismuth tantalate (SBT). Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
receiving an access request for a memory cell in a memory bank of a memory array that includes a plurality of memory sections, each memory section having a plurality of physical rows of memory cells;
identifying a memory section of the plurality of memory sections of the memory bank in which the memory cell is located;
identifying, in the memory section, a physical row of the plurality of physical rows of memory cells that comprises the memory cell;
identifying, in the physical row, a memory page that comprises the memory cell, wherein the physical row comprises a first quantity of memory cells selectively coupled with a second quantity of sense components, wherein each sense component is selectively coupled with a respective plurality of memory cells of the physical row, and the memory page comprises a third quantity of memory cells equal to the second quantity of sense components, the first quantity greater than the second quantity; and
generating a logic row address to open the memory page.

2. The method of claim 1, wherein the memory cell is located in a second memory section and the second memory section is linked to a first memory section, and wherein generating the logic row address comprises:
generating the logic row address that identifies the first memory section; and
sending the logic row address to a row decoder, wherein the physical row of the second memory section is accessible by the row decoder based at least in part on the logic row address identifying the first memory section and the linking between the first memory section and the second memory section.

3. The method of claim 1, further comprising:
identifying a page size of the memory page from a plurality of page sizes in which the memory array is accessible, the page size being an integer multiple of a base page size, wherein the base page size is associated with a subset of memory cells within a row of the memory array, wherein the subset of memory cells comprises a number of memory cells corresponding to a plurality of sense components associated with the memory array.

4. The method of claim 3, wherein generating the logic row address comprises generating the logic row address in accordance with the page size.

5. The method of claim 4, wherein the logic row address comprises a bit string, and a length of the bit string is based at least in part on the page size.

6. The method of claim 3, further comprising:
accessing the physical row of the memory array based at least in part on the page size, wherein the accessing includes activating each memory cell within the row;
sensing the subset of memory cells of the row via a subset of a plurality of access lines; and
determining a logic value of each memory cell of the subset of memory cells.

7. The method of claim 1, wherein the logic row address is based at least in part on the physical row and the memory page.

8. The method of claim 7, wherein the logic row address comprises a bit string.

9. A memory system, comprising:
processing circuitry associated with one or more memory devices, wherein the processing circuitry is configured to cause the memory system to:
receive an access request for a memory cell in a memory bank of a memory array that includes a plurality of memory sections, each memory section having a plurality of physical rows of memory cells;
identify a memory section of the plurality of memory sections of the memory bank in which the memory cell is located;
identify, in the memory section, a physical row of the plurality of physical rows of memory cells that comprises the memory cell;
identify, in the physical row, a memory page that comprises the memory cell, wherein the physical row comprises a first quantity of memory cells selectively coupled with a second quantity of sense components, wherein each sense component is selectively coupled with a respective plurality of memory cells of the physical row, and the memory page comprises a third quantity of memory cells equal to the second quantity of sense components, the first quantity greater than the second quantity; and
generate a logic row address to open the memory page.

10. The memory system of claim 9, wherein the memory cell is located in a second memory section and the second memory section is linked to a first memory section, and wherein to generate the logic row address the processing circuitry is configured to cause the memory system to:
generate the logic row address that identifies the first memory section; and
send the logic row address to a row decoder, wherein the physical row of the second memory section is accessible by the row decoder based at least in part on the logic row address identifying the first memory section and the linking between the first memory section and the second memory section.

11. The memory system of claim 9, wherein the processing circuitry is further configured to cause the memory system to:
identify a page size of the memory page from a plurality of page sizes in which the memory array is accessible, the page size being an integer multiple of a base page size, wherein the base page size is associated with a subset of memory cells within a row of the memory array, wherein the subset of memory cells comprises a number of memory cells corresponding to a plurality of sense components associated with the memory array.

12. The memory system of claim 11, wherein generating the logic row address comprises generating the logic row address in accordance with the page size.

13. The memory system of claim 12, wherein:
the logic row address comprises a bit string, and
a length of the bit string is based at least in part on the page size.

14. The memory system of claim 11, wherein the processing circuitry is further configured to cause the memory system to:
access the physical row of the memory array based at least in part on the page size, wherein the accessing includes activating each memory cell within the row;
sense the subset of memory cells of the row via a subset of a plurality of access lines; and
determine a logic value of each memory cell of the subset of memory cells.

15. The memory system of claim 9, wherein the logic row address is based at least in part on the physical row and the memory page.

16. The memory system of claim 15, wherein the logic row address comprises a bit string.

17. A non-transitory computer-readable medium storing code, the code comprising instructions executable by processing circuitry to:
receive an access request for a memory cell in a memory bank of a memory array that includes a plurality of memory sections, each memory section having a plurality of physical rows of memory cells;
identify a memory section of the plurality of memory sections of the memory bank in which the memory cell is located;
identify, in the memory section, a physical row of the plurality of physical rows of memory cells that comprises the memory cell;
identify, in the physical row, a memory page that comprises the memory cell, wherein the physical row comprises a first quantity of memory cells selectively coupled with a second quantity of sense components, wherein each sense component is selectively coupled with a respective plurality of memory cells of the physical row, and the memory page comprises a third quantity of memory cells equal to the second quantity of sense components, the first quantity greater than the second quantity; and
generate a logic row address to open the memory page.

18. The non-transitory computer-readable medium of claim 17, wherein the memory cell is located in a second memory section and the second memory section is linked to a first memory section, and wherein the instructions to generate the logic row address are executable by the processing circuitry to:
generate the logic row address that identifies the first memory section; and
send the logic row address to a row decoder, wherein the physical row of the second memory section is accessible by the row decoder based at least in part on the logic row address identifying the first memory section and the linking between the first memory section and the second memory section.

19. The non-transitory computer-readable medium of claim 17, wherein the instructions are further executable by the processing circuitry to:

identify a page size of the memory page from a plurality of page sizes in which the memory array is accessible, the page size being an integer multiple of a base page size, wherein the base page size is associated with a subset of memory cells within a row of the memory array, wherein the subset of memory cells comprises a number of memory cells corresponding to a plurality of sense components associated with the memory array.

20. The non-transitory computer-readable medium of claim 19, wherein generating the logic row address comprises generating the logic row address in accordance with the page size.

\* \* \* \* \*